US012683589B2

(12) United States Patent
Chen et al.

(10) Patent No.: US 12,683,589 B2
(45) Date of Patent: Jul. 14, 2026

(54) SIGNAL TRANSPORTING SYSTEM AND SIGNAL TRANSPORTING METHOD

(71) Applicant: Realtek Semiconductor Corp., HsinChu (TW)

(72) Inventors: Shih-Chang Chen, HsinChu (TW); Chih-Wei Chang, HsinChu (TW); Chun-Chi Yu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 85 days.

(21) Appl. No.: 18/779,093

(22) Filed: Jul. 22, 2024

(65) Prior Publication Data

US 2025/0096784 A1      Mar. 20, 2025

(30) Foreign Application Priority Data

Sep. 20, 2023    (TW) .................................. 112135853

(51) Int. Cl.
*H03K 5/00*                (2006.01)

(52) U.S. Cl.
CPC ..... *H03K 5/00* (2013.01); *H03K 2005/00019* (2013.01); *H03K 2005/00241* (2013.01)

(58) Field of Classification Search
CPC ...................................................... H03K 5/00
See application file for complete search history.

(56) References Cited

U.S. PATENT DOCUMENTS

| | | | | |
|---|---|---|---|---|
| 4,057,741 | A | * | 11/1977 | Piguet .............. H03K 3/356104 |
| | | | | 377/79 |
| 6,405,228 | B1 | * | 6/2002 | Williams ............. H03K 5/1252 |
| | | | | 708/300 |
| 6,525,565 | B2 | * | 2/2003 | Young ..................... H04J 3/047 |
| | | | | 326/46 |
| 6,614,371 | B2 | * | 9/2003 | Zhang .................... H03M 9/00 |
| | | | | 341/100 |
| 6,642,760 | B1 | * | 11/2003 | Alon ..................... H03L 7/0802 |
| | | | | 327/158 |
| 7,135,899 | B1 | * | 11/2006 | Sancheti ............... H04J 3/0685 |
| | | | | 327/144 |
| 7,193,401 | B1 | | 3/2007 | Hasegawa |
| 7,317,644 | B1 | * | 1/2008 | Lin ....................... G11C 7/1051 |
| | | | | 365/194 |
| 7,864,084 | B2 | * | 1/2011 | Padaparambil ......... H03M 9/00 |
| | | | | 341/100 |
| 10,062,407 | B1 | * | 8/2018 | Yoo .......................... G11B 5/09 |
| 10,496,569 | B2 | * | 12/2019 | Tatsumura ........... H03K 19/177 |
| 12,300,348 | B2 | * | 5/2025 | Kim .................... G11C 11/4093 |
| 12,334,938 | B2 | * | 6/2025 | Agrawal ............... H03L 7/0818 |
| 2012/0081164 | A1 | * | 4/2012 | Ricavy ................... H03K 3/033 |
| | | | | 327/299 |

(Continued)

FOREIGN PATENT DOCUMENTS

CN        108022610 B    10/2021
TW        202329107 A    7/2023

*Primary Examiner* — Menatoallah Youssef
*Assistant Examiner* — Khareem E Almo
(74) *Attorney, Agent, or Firm* — Winston Hsu

(57) ABSTRACT

A signal transporting system, comprising: a signal transporting circuit, configured to receive an input signal to generate an output signal; and a signal timing adjusting circuit, configured to adjust an output timing of the output signal according to a signal pattern of the input signal.

18 Claims, 8 Drawing Sheets

(56)         References Cited

U.S. PATENT DOCUMENTS

| | | | |
|---|---|---|---|
| 2012/0326760 A1* | 12/2012 | Kesselring ............. | H03K 3/017 |
| | | | 327/175 |
| 2023/0136561 A1* | 5/2023 | Boujamaa ................. | G06F 1/08 |
| | | | 375/376 |
| 2025/0096784 A1* | 3/2025 | Chen ........................ | H03K 5/00 |

* cited by examiner

SIGNAL TRANSPORTING SYSTEM AND SIGNAL TRANSPORTING METHOD

BACKGROUND OF THE INVENTION

1. Field of the Invention

The present invention relates to a signal transporting system and a signal transporting method, and particularly relates to a signal transporting system and a signal transporting method which can improve a reception success rate, a reception stability, and an anti-noise ability.

2. Description of the Prior Art

A DRAM (Dynamic random-access memory) is a well-known electronic device in modern times. It always comprises a data transmission circuit to receive data and accurately transmit the data to the DRAM. However, data transmission is often delayed due to the transporting path. The impact of these delays will be particularly obvious when the DRAM has a high operating speed or the data has a specific data format, thereby affecting the signal quality of the signal received by the DRAM and reducing the success rate of the DRAM receiving data.

SUMMARY OF THE INVENTION

An objective of the present invention is to provide a signal transporting system which allows the signal received by the receiving end to have better signal quality, lower noise, and better data reception success rate.

Another objective of the present invention is to provide a signal transporting method which allows the signal received by the receiving end to have better signal quality, lower noise, and better data reception success rate.

One embodiment of the present invention discloses a signal transporting system, comprising: a signal transporting circuit, configured to receive an input signal to generate an output signal; and a signal timing adjusting circuit, configured to adjust an output timing of the output signal according to a signal pattern of the input signal.

Another embodiment of the present invention discloses a signal transporting method, comprising: receiving an input signal to generate an output signal by a signal transporting circuit; and adjusting an output timing of the output signal according to a signal pattern of the input signal by a signal timing adjusting circuit.

In view of above-mentioned embodiments, the output timing of the output signal can be adjusted according to the signal pattern, so that the signal received by the receiving end has better signal quality, lower noise, and better data reception success rate.

These and other objectives of the present invention will no doubt become obvious to those of ordinary skill in the art after reading the following detailed description of the preferred embodiment that is illustrated in the various FIG.s and drawings.

DETAILED DESCRIPTION

In the following descriptions, several embodiments are provided to explain the concept of the present application. The term "first", "second", "third" in following descriptions are only for the purpose of distinguishing different one elements, and do not mean the sequence of the elements. For example, a first device and a second device only mean these devices can have the same structure but are different devices.

Figure 1:
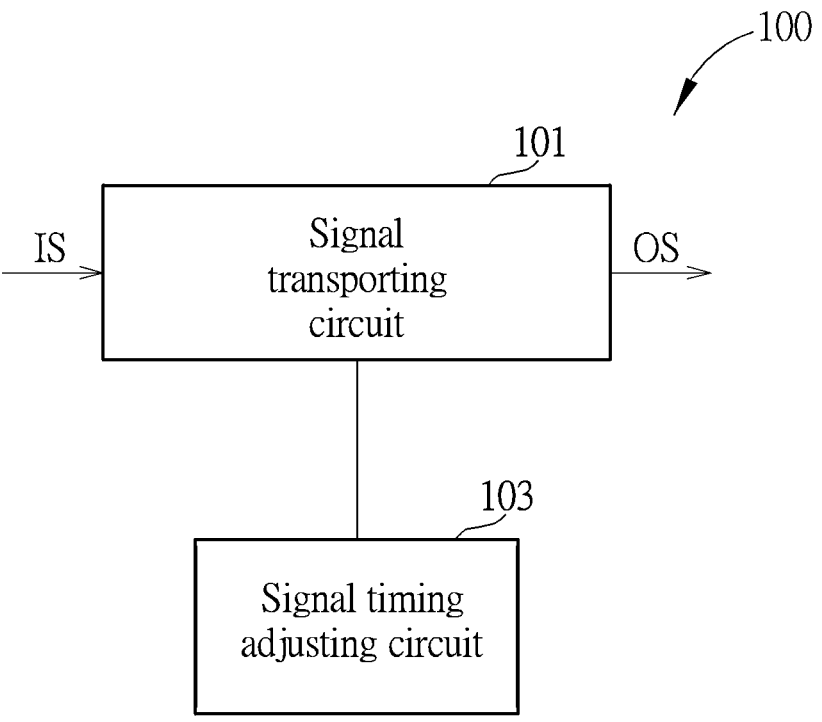
FIG. 1 is a block diagram illustrating a signal transporting system according to one embodiment of the present invention.

FIG. 1 is a block diagram illustrating a signal transporting system 100 according to one embodiment of the present invention. As shown in FIG. 1, the signal transporting system 100 comprises a signal transporting circuit 101 and a signal timing adjusting circuit 103. The signal transporting circuit 101 is configured to receive an input signal IS to generate an output signal OS. The signal timing adjusting circuit 103 is configured to adjust the output timing of the output signal OS according to a signal pattern of the input signal IS. More specifically, in one embodiment, the signal pattern represents the bit distribution state of the input signal IS, such as 00001111 or 01010101. The output timing represents the timing of the high and low logic levels of the output signal OS and the timing of positive and negative edges. In one embodiment, the ratio between high and low logic levels of the output signal OS and the timing relationship between positive and negative edges are the same before and after adjusted by the signal timing adjusting circuit 103. In other words, the action of the signal timing adjusting circuit 103 adjusting the output timing of the output signal OS does not affect the waveform of the output signal OS. In one embodiment, the signal transporting system 100 is a DRAM data transmission system, so the input signal IS and the output signal OS both contain data to be transmitted to the DRAM.

In one embodiment, if the signal pattern has at least two continuous first bits and a second bit following the first bits, the signal timing adjusting circuit 103 causes the output signal to be output in advance, and the first bits and the second bit have different logical values. In one embodiment, the first bit is 0 and the second bit is 1, for example, the signal pattern has a bit distribution of 001. In one embodiment, the first bit is 1 and the second bit is 0, for example, the signal pattern has a bit distribution of 110. The advantage of such method is that when the signal has continuous bits with the same logic values and then the logic value is converted, it takes time to convert the logic value. In this case, the delay caused by the transporting path for transmitting the output signal OS to a target electronic device (e.g., a DRAM) will be quite obvious, so that the signal quality received by the receiving end (such as the DRAM end) will become worse due to the delay, thereby affecting the quality of the signal and affecting correct reception rate of data.

Therefore, if the output signal OS with such a signal pattern is output in advance, the aforementioned delay problem can be compensated.

In one embodiment, the signal with the signal pattern which has at least two continuous first bits and a second bit following the first bits maybe 0010. In such case, the output signal OS which comprises 001 is output in advance, but the last bit 0 is output normally (i.e., not in advance). By this way, the output of the third bit 1 is triggered in advance but ends normally, thus the output third bit 1 has a wider pulse. Thereby, resistance for ISI (Inter symbol interference) may be stronger and a larger bandwidth can be provided.

Figure 2:
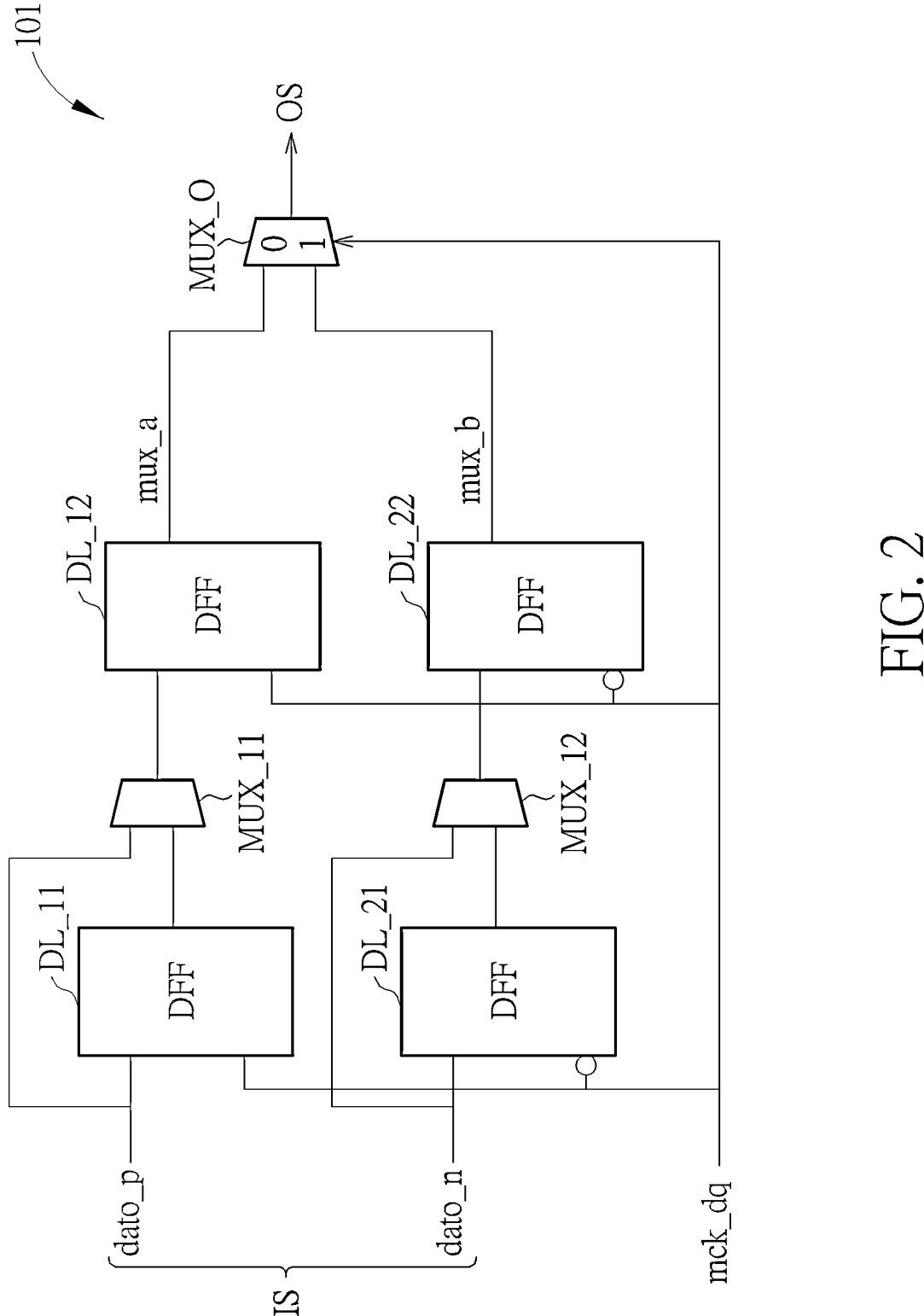
FIG. 2 is a block diagram illustrating a signal transporting circuit according to one embodiment of the present invention.

FIG. 2 is a block diagram illustrating a signal transporting circuit according to one embodiment of the present invention. As shown in FIG. 2, flip-flops DL_11, DL_12 and multiplexer MUX_11 constitute two first shift registers, which generate a first signal mux_a according to a plurality of positive edges of a control signal mck_dq. The flip-flops DL_21, DL_22 and the multiplexer MUX_12 constitute two second shift registers, which generate a second signal mux_b according to a plurality of negative edges of the control signal mck_dq. The multiplexer MUX_11 is configured to selectively output the first signal mux_a or the second signal mux_a as the output signal OS according to the control signal mck_dq. In the embodiment of FIG. 2, the input signal IS of FIG. 1 comprises data dato_p, dato_n.

Figure 3:
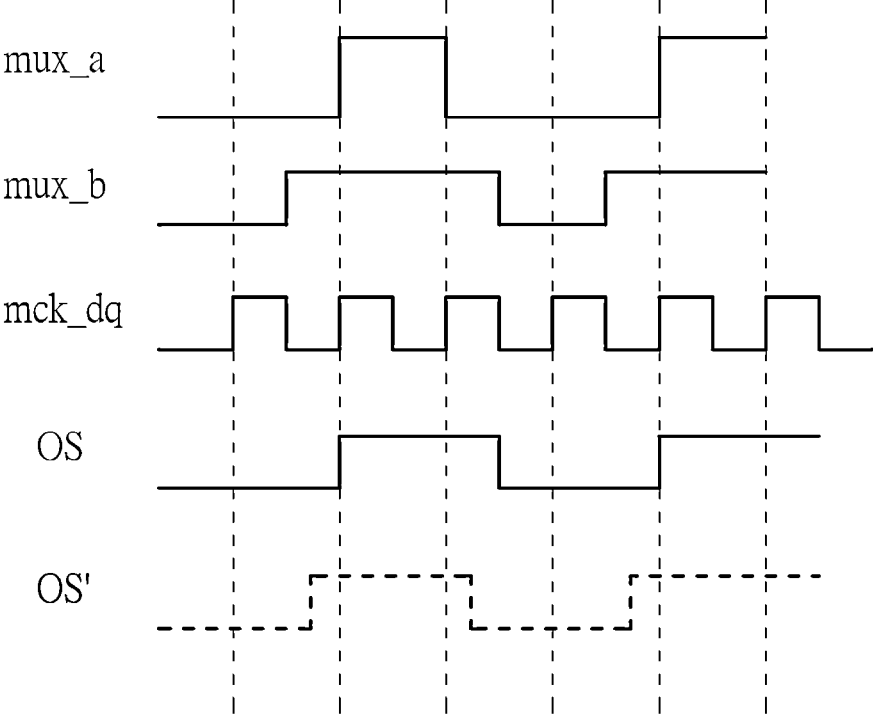
FIG. 3 is a schematic diagram illustrating operations of the signal transporting circuit illustrated in FIG. 2, according to one embodiment of the present invention.

FIG. 3 is a schematic diagram illustrating operations of the signal transporting circuit illustrated in FIG. 2, according to one embodiment of the present invention. As shown in FIG. 2 and FIG. 3, the control signal mck_dq is used to control the first multiplexer MUX_O to select which one of the first signal mux_a and the second signal mux_b is to be output. When the control signal mck_dq has a high logic level, the first multiplexer MUX_O outputs the second signal mux_b as the output signal OS. On the contrary, when the control signal mck_dq has a low logic level, the first multiplexer MUX_O outputs the first signal mux_a as the output signal OS.

Figure 4:
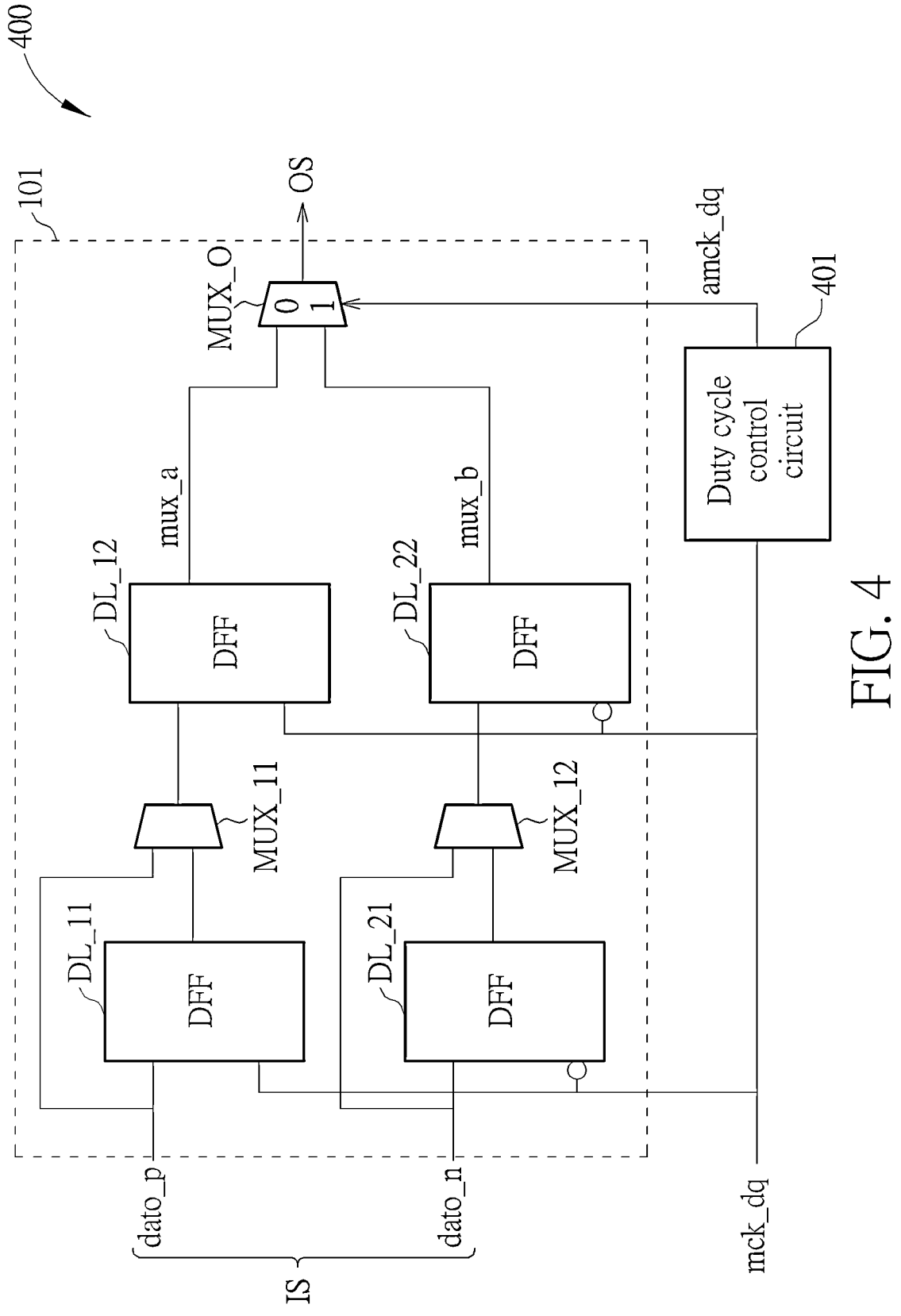
FIG. 4, FIG. 5 and FIG. 6 are circuit diagrams of the signal timing adjusting circuits according to different embodiments of the present invention.
Figure 5:
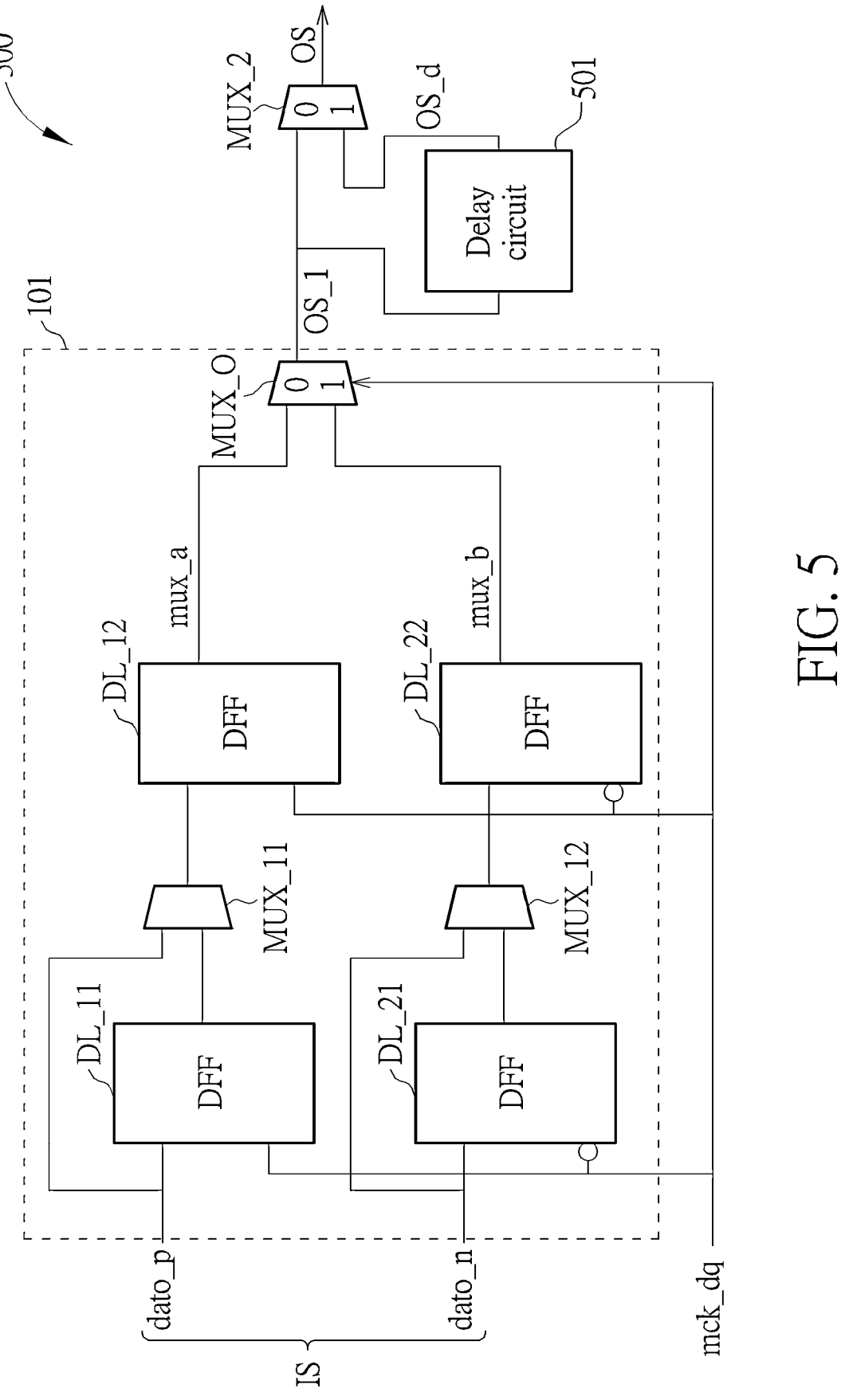
Figure 6:
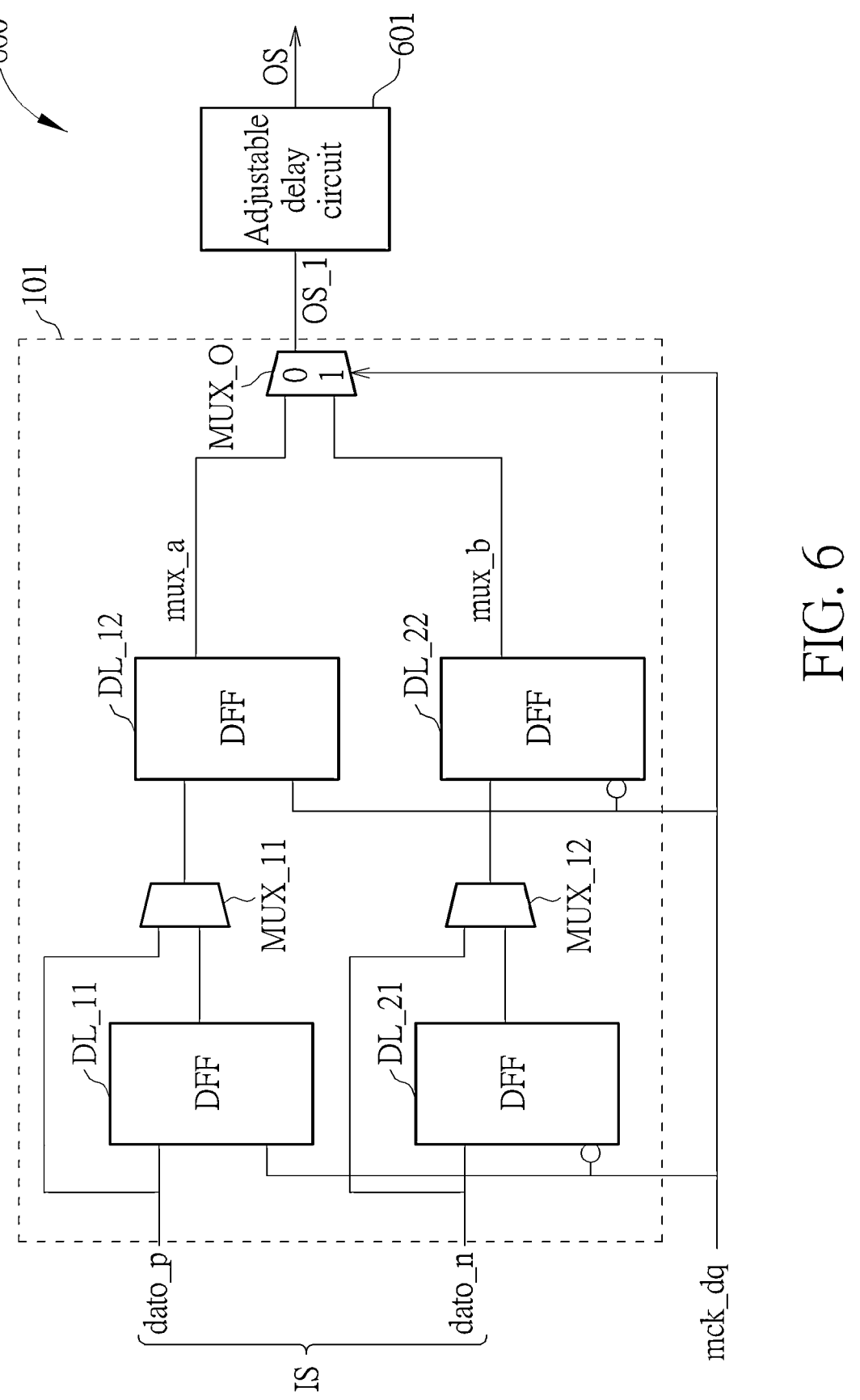

FIG. 4, FIG. 5 and FIG. 6 are circuit diagrams of the signal timing adjusting circuits according to different embodiments of the present invention. In following embodiments, the output signal OS represents a signal output to a connection pad connected to a target electronic device (e.g., a DRAM) through processing by the signal transporting circuit or through processing by the signal transporting circuit and the signal timing adjusting circuit. In the embodiment of FIG. 4, the signal transporting system 400 further comprises a duty cycle control circuit 401 in addition to the signal transporting circuit 101 shown in FIG. 2. The duty cycle control circuit 401 is configured to control a duty cycle of the control signal mck_dq (i.e., the ratio of high logic level and low logic level) to adjust the output timing accordingly. As mentioned above, when the control signal mck_dq has a high logic level, the multiplexer MUX_O outputs the second signal mux_b as the output signal OS. On the contrary, when the control signal mck_dq has a low logic level, the multiplexer MUX_O outputs the first signal mux_a as the output signal OS. Therefore, the duty cycle control circuit 401 generates an adjusted control signal amck_dq by adjusting a duty cycle of mck_dq, and generates the output signal OS according to the high logic level and low logic level of the adjusted control signal amck_dq, so that the output timing of the output signal OS can be adjusted. As above-mentioned, the output timing represents the timing of the high and low logic levels and the timing of positive and negative edges of the output signal OS. In one embodiment, the timing relationship between positive and negative edges and the ratio between the high and low logic levels of the output signal OS generated according to the control signal mck_dq, are the same as the timing relationship between positive and negative edges and the ratio between the high and low logic levels of the output signal OS generated according to the adjusted control signal amck_dq. In other words, the waveform of the output signal OS generated according to the control signal mck_dq is the same as the waveform of the output signal OS generated according to the adjusted control signal amck_dq. For example, as shown in FIG. 3, the output signal OS is adjusted to the output signal OS' to be output in advance. The adjusted duty cycle of the control signal mck_dq will vary depending on the state of the input data IS, so it is not shown here.

In the embodiment of FIG. 5, in addition to the signal transporting circuit 101 shown in FIG. 2, the signal transporting system 500 further comprises a delay circuit 501 and a second multiplexer MUX_2. The delay circuit 501 is configured to receive a first output signal OS_1 generated by the signal transporting circuit to generate a delayed output signal OS_d. The second multiplexer MUX_2 is configured to selectively output the first output signal OS_1 or the delayed output signal OS_d as the output signal OS. In one embodiment, when the signal transporting system 500 operates in the normal state, that is, when the output signal OS does not need to be compensated, the second multiplexer MUX_2 outputs the delayed output signal OS_d as the output signal OS. When the signal transporting system 500 operates in the calibration state, that is, when the output timing of the output signal OS needs to be adjusted for compensation, the second multiplexer MUX_2 output the first output signal OS_1 as the output signal OS, so that the output timing of the output signal OS is advanced.

The aforementioned delay circuit 501 and the second multiplexer MUX_2 can be replaced by an adjustable delay circuit. In the embodiment of FIG. 6, the signal transporting system 600 further comprises an adjustable delay circuit 601 in addition to the components shown in FIG. 2. The adjustable delay circuit 601 is configured to delay the first output signal OS_1 to correspondingly adjust the output timing of the output signal OS. In one embodiment, when the signal transporting system 600 operates in a normal state, that is, when the output signal OS does not need to be compensated, the adjustable delay circuit 601 will have a larger delay amount. When the signal transporting system 600 operates in the correction state, that is, when the output signal OS needs to be compensated, the adjustable delay circuit 601 will have a smaller delay amount to advance the output timing of the output signal OS.

In the above-mentioned embodiments, the output signal OS is outputted in advance to improve the signal quality. However, the output signal OS can also be delayed to improve the signal quality.

Figure 7:
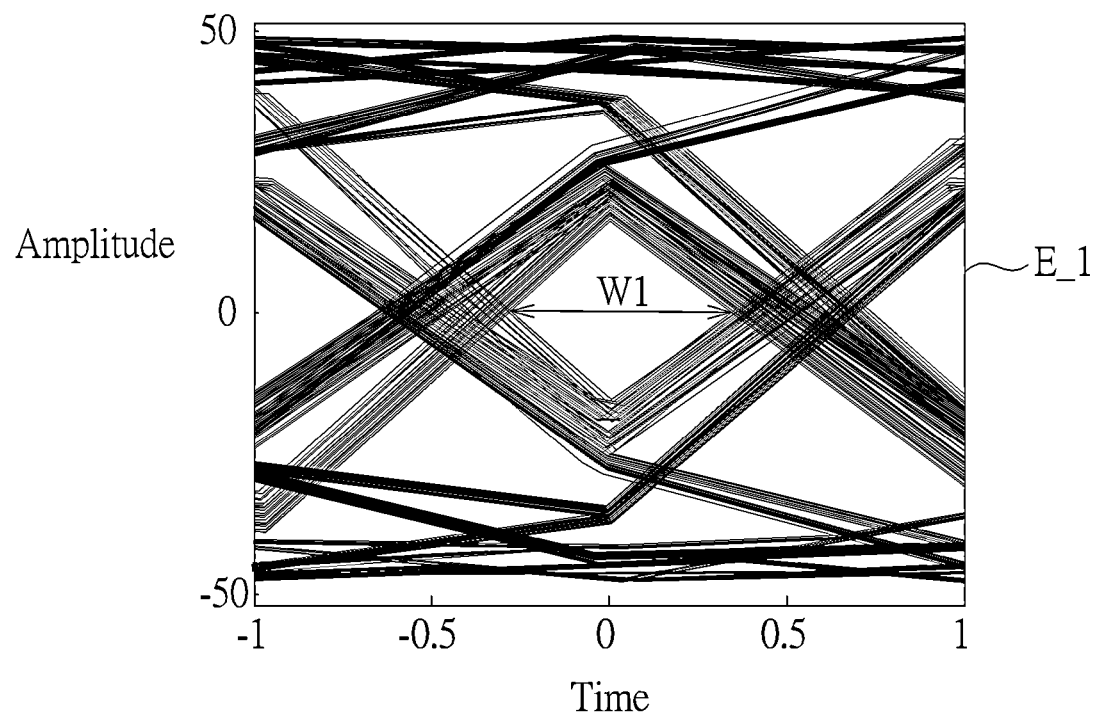
FIG. 7 is a schematic diagram illustrating an eye diagram of a receiving end which is not compensated and an eye diagram of a receiving end which has been compensated.
Figure 7:
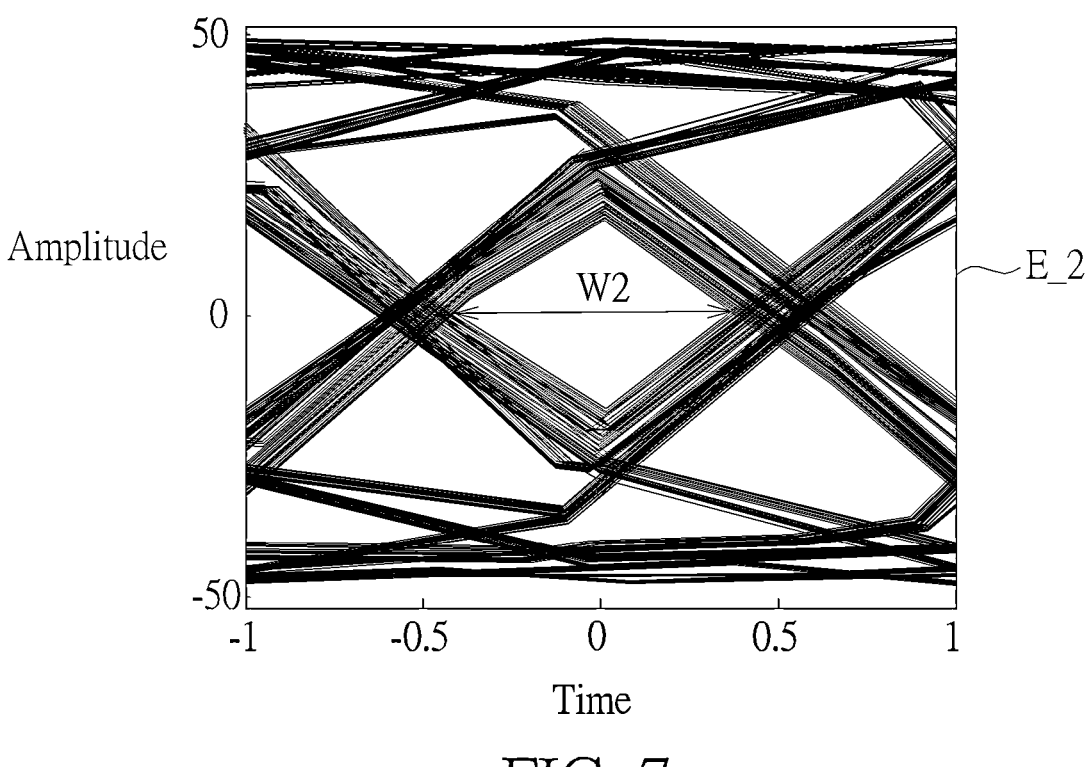

As mentioned above, the delay caused by the transporting path for transmitting the output signal OS to a target electronic device (e.g., a DRAM) will cause the signal quality received by the receiving end (such as the DRAM end) to become worse due to the delay, and then affects the correct reception rate of data. Therefore, if the output timing of the output signal OS is changed, the aforementioned delay problem may be compensated. The quality of the signal can be represented by the eye width of the eye diagram. FIG. 7 is a schematic diagram illustrating an eye diagram of a receiving end which is not compensated and an eye diagram of a receiving end which has been compensated. As shown in FIG. 7, eye diagram E_1 has an eye width W_1 and the eye diagram E_2 has an eye width W_2. The eye width W_2 is larger than the eye width W_1, so the signal quality represented by the eye diagram E_2 is higher than the signal quality represented by the eye diagram E_1. The eye width of the eye diagram also corresponds to the part that can receive data more accurately. Therefore, when the signal state corresponds to the eye diagram E_2, the receiving end will also have a better data reception rate.

Figure 8:
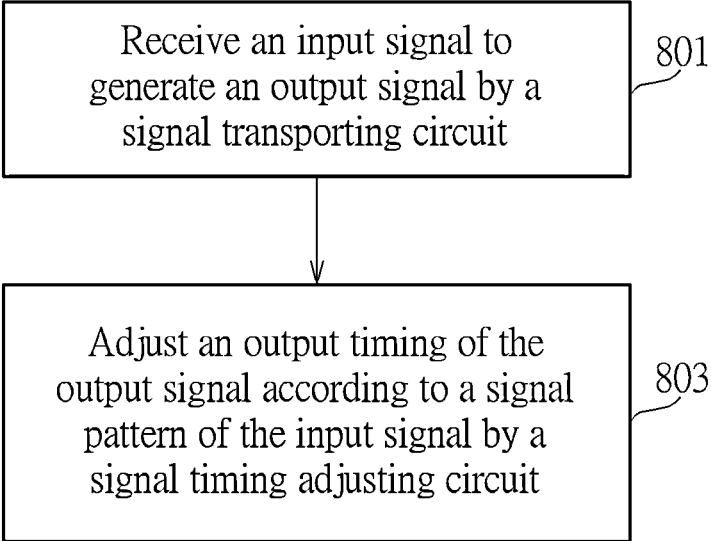
FIG. 8 is a flow chart illustrating a signal transmitting method according to one embodiment of the present invention.

According to above-mentioned embodiments, a signal transporting method may be obtained. FIG. 8 is a flow chart illustrating a signal transmitting method according to one embodiment of the present invention, which comprises the following steps:

Step 801

Receive an input signal to generate an output signal by a signal transporting circuit.

For example, the input signal IS and the output signal OS in FIG. 1 are used in the step 801. The input signal IS and the output signal OS may contain data to be provided to the DRAM.

Step 803

Adjust an output timing of the output signal according to a signal pattern of the input signal by a signal timing adjusting circuit.

For example, cause the output signal to be output in advance.

In view of above-mentioned embodiments, the output timing of the output signal can be adjusted according to the signal pattern, so that the signal received by the receiving end has better signal quality, lower noise, and better data reception success rate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal transporting system, comprising:
a signal transporting circuit, configured to receive an input signal to generate an output signal; and
a signal timing adjusting circuit, configured to adjust an output timing of the output signal according to a signal pattern of the input signal;
wherein if the signal pattern has at least two continuous first bits and a second bit following the first bits, the signal timing adjusting circuit causes the output signal to be output in advance, wherein the first bits and the second bit comprise different logic values.

2. The signal transporting system of claim 1, wherein the signal timing adjusting circuit causes the output signal to be output in advance according to the signal pattern.

3. The signal transporting system of claim 1, wherein the first bits are 0 and the second bit is 1.

4. The signal transporting system of claim 1, wherein the first bits are 1 and the second bit is 0.

5. The signal transporting system of claim 1, wherein the signal transporting circuit comprises:
a plurality of first shift registers, configured to generate a first signal according to a plurality of positive edges of a control signal;
a plurality of second shift registers, configured to generate a second signal according to a plurality of negative edges of the control signal; and
a first multiplexer, configured to selectively output the first signal or the second signal as the output signal according to the control signal.

6. The signal transporting system of claim 5, wherein the first shift registers and the second shift registers respectively comprises a D flip flop.

7. The signal transporting system of claim 5, wherein the signal timing adjusting circuit further comprises a duty cycle control circuit, wherein the duty cycle control circuit controls a duty cycle of the control signal to correspondingly adjust the output timing.

8. The signal transporting system of claim 1, wherein the signal timing adjusting circuit further comprises an adjustable delay circuit, wherein the adjustable delay circuit is configured to delay the output signal to correspondingly adjust the output timing.

9. The signal transporting system of claim 1, wherein the signal timing adjusting circuit comprises:
a delay circuit, configured to receive a first output signal generated by the signal transporting circuit to generate a delayed output signal; and
a second multiplexer, configured to selectively output the first signal or the delayed output signal as the output signal according to the control signal.

10. A signal transporting method, comprising:
receiving an input signal to generate an output signal by a signal transporting circuit; and
adjusting an output timing of the output signal according to a signal pattern of the input signal by a signal timing adjusting circuit;
wherein if the signal pattern has at least two continuous first bits and a second bit following the first bits, the signal timing adjusting circuit causes the output signal to be output in advance, wherein the first bits and the second bit comprise different logic values.

11. The signal transporting method of claim 10, wherein the signal timing adjusting circuit causes the output signal to be output in advance according to the signal pattern.

12. The signal transporting method of claim 10, wherein the first bits are 0 and the second bit is 1.

13. The signal transporting method of claim 10, wherein the first bits are 1 and the second bit is 0.

14. The signal transporting method of claim 10, wherein the signal transporting circuit comprises a plurality of first shift registers, a plurality of first shift registers and a first multiplexer, wherein the signal transporting method further comprises:
using the first shift registers to generate a first signal according to a plurality of positive edges of a control signal;
using the second shift registers to generate a second signal according to a plurality of negative edges of the control signal; and
using the first multiplexer to selectively output the first signal or the second signal as the output signal according to the control signal.

15. The signal transporting method of claim 14, wherein the first shift registers and the second shift registers respectively comprises a D flip flop.

16. The signal transporting method of claim 14, wherein the signal timing adjusting circuit further comprises a duty cycle control circuit, wherein the signal transporting method further comprises using the duty cycle control circuit to control a duty cycle of the control signal to correspondingly adjust the output timing.

17. The signal transporting method of claim 10, wherein the signal timing adjusting circuit further comprises an adjustable delay circuit, wherein the signal transporting method further comprises using the adjustable delay circuit to delay the output signal to correspondingly adjust the output timing.

18. The signal transporting method of claim 10, wherein the signal timing adjusting circuit comprises a delay circuit and a second multiplexer, wherein the signal transporting method further comprises:

using the delay circuit to receive a first output signal generated by the signal transporting circuit to generate a delayed output signal; and using the second multiplexer to selectively output the first signal or the delayed output signal as the output signal according to the control signal.

\* \* \* \* \*